US010957815B2

(12) United States Patent
Tsukamoto et al.

(10) Patent No.: US 10,957,815 B2
(45) Date of Patent: Mar. 23, 2021

(54) LIGHT-EMITTING DEVICE

(71) Applicant: Sharp Kabushiki Kaisha, Sakai (JP)

(72) Inventors: Yuto Tsukamoto, Sakai (JP); Shinichi Kawato, Sakai (JP); Tokiyoshi Umeda, Sakai (JP); Manabu Niboshi, Sakai (JP); Youhei Nakanishi, Sakai (JP); Hisayuki Utsumi, Sakai (JP); Masayuki Kanehiro, Sakai (JP); Shota Okamoto, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 105 days.

(21) Appl. No.: 16/468,789

(22) PCT Filed: Sep. 5, 2017

(86) PCT No.: PCT/JP2017/031896
§ 371 (c)(1),
(2) Date: Jun. 12, 2019

(87) PCT Pub. No.: WO2019/049192
PCT Pub. Date: Mar. 14, 2019

(65) Prior Publication Data
US 2020/0381585 A1 Dec. 3, 2020

(51) Int. Cl.
*H01L 27/15* (2006.01)
*H01L 29/26* (2006.01)
(Continued)

(52) U.S. Cl.
CPC ............ *H01L 33/06* (2013.01); *H01L 33/382* (2013.01)

(58) Field of Classification Search
CPC .............................. H01L 33/06; H01L 33/382
See application file for complete search history.

(56) References Cited

U.S. PATENT DOCUMENTS 9,166,363 B2 * 10/2015 Jain ........................ H01S 5/021
2003/0143427 A1   7/2003 Matsuo et al.
(Continued)

FOREIGN PATENT DOCUMENTS

JP   2002-069427 A   3/2002
JP   2006-135208 A   5/2006
(Continued)

OTHER PUBLICATIONS

Official Communication issued in International Patent Application No. PCT/JP2017/031896, dated Dec. 5, 2017.
(Continued)

*Primary Examiner* — Ismail A Muse
(74) *Attorney, Agent, or Firm* — Keating & Bennett, LLP

(57) ABSTRACT

To provide a light-emitting device for achieving fluorescence emission with higher efficiency and longer life, a light-emitting device includes an exciton generation layer in which quantum dots are dispersed, a light-emitting layer in which light emitters, which are phosphors or phosphorescent members, are dispersed, the light-emitting layer adjoining the exciton generation layer in a vertical direction, a first electrode located on a lower side of the exciton generation layer and the light-emitting layer, and a second electrode located on an upper side of the exciton generation layer and the light-emitting layer, and the light emission spectrum of the quantum dots and the absorption spectrum of the light emitters at least partially overlap.

19 Claims, 7 Drawing Sheets

(51) Int. Cl.
*H01L 31/12* (2006.01)
*H01L 33/00* (2010.01)
*H01L 33/06* (2010.01)
*H01L 33/38* (2010.01)

(56) References Cited

U.S. PATENT DOCUMENTS

| | | | |
|---|---|---|---|
| 2004/0183082 A1* | 9/2004 | Yamazaki | H01L 51/5036 257/79 |
| 2007/0242713 A1 | 10/2007 | Spariosu et al. | |
| 2012/0104439 A1* | 5/2012 | Kim | H01L 33/08 257/9 |
| 2012/0193604 A1* | 8/2012 | Kim | H01L 33/501 257/9 |
| 2012/0195022 A1* | 8/2012 | Skipor | G06F 1/3218 362/84 |
| 2014/0185640 A1* | 7/2014 | Jain | H01S 5/021 372/45.011 |
| 2014/0225145 A1* | 8/2014 | Masuda | H01J 1/63 257/98 |
| 2015/0221834 A1* | 8/2015 | Needham | H01L 33/502 257/89 |
| 2015/0287927 A1* | 10/2015 | Okubo | H01L 51/004 257/40 |
| 2018/0088404 A1* | 3/2018 | Chae | G02F 1/133514 |
| 2018/0375050 A1* | 12/2018 | Ito | H01L 51/5016 |
| 2019/0092947 A1* | 3/2019 | Yamane | C09D 5/004 |
| 2020/0243616 A1* | 7/2020 | Boardman | H01L 51/502 |
| 2020/0303670 A1* | 9/2020 | Tsukamoto | H01L 51/5218 |
| 2020/0326597 A1* | 10/2020 | Rogojina | G02F 1/133719 |

FOREIGN PATENT DOCUMENTS

| | | |
|---|---|---|
| JP | 2006-164938 A | 6/2006 |
| JP | 2006-185985 A | 7/2006 |
| JP | 2006-332490 A | 12/2006 |

OTHER PUBLICATIONS

Kaiser et al., "Förster resonance energy transfer mediated enhancement of the fluorescence lifetime of organic fluorophores to the millisecond range by coupling to Mn-doped CdS/ZnS quantum dots", Nanotechnology, vol. 27, No. 5, Dec. 16, 2015, pp. 1-8.

Achermann et al., "Nanocrystal-Based Light-Emitting Diodes Utilizing High-Efficiency Nonradiative Energy Transfer for Color Conversion", Nano Letters, vol. 6, No. 7, 2006, pp. 1386-1400.

* cited by examiner

LIGHT-EMITTING DEVICE

TECHNICAL FIELD

The disclosure relates to a light-emitting device including a light-emitting element including quantum dots.

BACKGROUND ART

PTL 1 discloses a light-emitting device including two electrodes and a light-emitting layer including quantum dots between the two electrodes.

CITATION LIST

Patent Literature

PTL 1: JP 2006-185985 A (published Jul. 13, 2006)

SUMMARY

Technical Problem

In PTL 1, excitons are generated at the quantum dots included in the light-emitting layer. In the case that the excitons are generated in the light-emitting layer, the luminous efficiency is disadvantageously reduced.

In addition, in a case that the light-emitting layer is formed by applying, impurities easily enter the light-emitting device and consequently the light emission lifetime of the element of the light-emitting device is disadvantageously shortened compared to the light-emitting layer formed by vapor deposition.

Solution to Problem

To solve the above-mentioned problems, a light-emitting device according to the disclosure includes an exciton generation layer in which quantum dots are dispersed; a light-emitting layer in which light emitters being phosphors or phosphorescent members are dispersed, the light-emitting layer adjoining the exciton generation layer in a vertical direction; a first electrode in a lower layer than the exciton generation layer and the light-emitting layer; and a second electrode in an upper layer than the exciton generation layer and the light-emitting layer. A light emission spectrum of the quantum dots and an absorption spectrum of the light emitters at least partially overlap each other.

In addition, in a method for manufacturing a light-emitting device according to the disclosure, the light-emitting device including: an exciton generation layer in which quantum dots are dispersed; a light-emitting layer in which light emitters being phosphors or phosphorescent members are dispersed, the light-emitting layer adjoining the exciton generation layer in a vertical direction, wherein an absorption spectrum of the light emitters at least partially overlaps a light emission spectrum of the quantum dots; a first electrode in a lower layer than the exciton generation layer and the light-emitting layer; and a second electrode in an upper layer than the exciton generation layer and the light-emitting layer, the method includes: an exciton generation layer forming step for forming the exciton generation layer; and a light-emitting layer forming step for forming the light-emitting layer. The light-emitting layer may be formed by applying while the light-emitting layer is more preferably formed by using vapor deposition process.

In addition, a manufacturing apparatus for a light-emitting device according to the disclosure includes: a film formation apparatus configured to form an exciton generation layer in which quantum dots are dispersed; a light-emitting layer in which light emitters being phosphors or phosphorescent members are dispersed, wherein an absorption spectrum of the light emitters at least partially overlaps a light emission spectrum of the quantum dots, a first electrode in a lower layer than the exciton generation layer and the light-emitting layer, and a second electrode in an upper layer than the exciton generation layer and the light-emitting layer.

Advantageous Effects of Disclosure

With the configuration described above, a light-emitting device can be provided that achieves light emission with higher efficiency and longer lifetime.

DESCRIPTION OF EMBODIMENTS

In the present specification, the direction from the light-emitting layer to the first electrode in the light-emitting device is referred to as "lower direction", and the direction from the light-emitting layer to the second electrode of the light-emitting device is referred to as "upper direction".

Figure 1A:
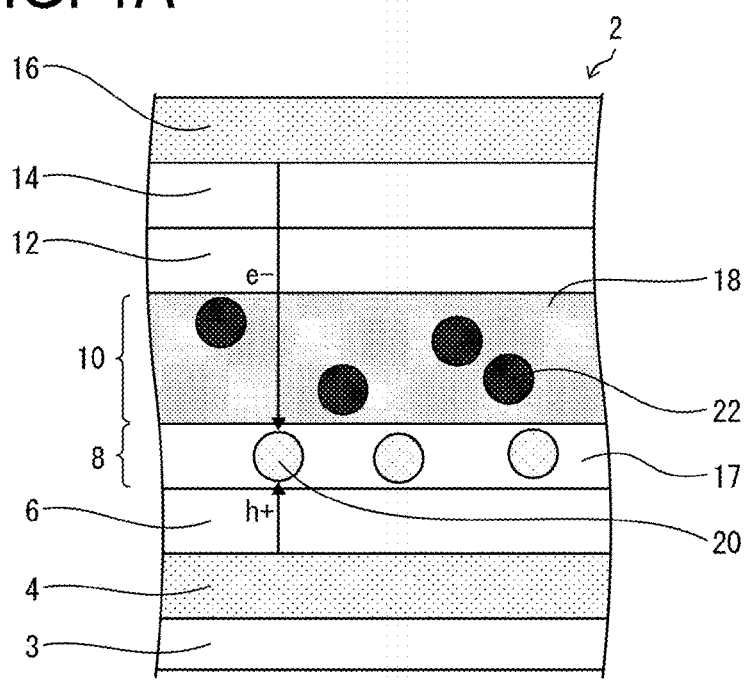
FIGS. 1A and 1B are a schematic sectional view of a light-emitting device according to a first embodiment of the disclosure, and a diagram illustrating examples of a light emission spectrum of quantum dots and an absorption spectrum of phosphors of the light-emitting device.

FIG. 1A is a schematic sectional view of a light-emitting device 2 according to the present embodiment.

As illustrated in FIG. 1A, the light-emitting device 2 has a structure in which layers are stacked on an array substrate 3 including a thin film transistor (TFT) not illustrated. A first electrode 4 formed in the upper layer of the array substrate 3 is electrically connected with the TFT of the array substrate 3. The light-emitting device 2 includes, on the first electrode 4, a hole injection layer 6, an exciton generation layer 8, a light-emitting layer 10, an electron transport layer 12, an electron injection layer 14, and a second electrode 16 in this order from the lower layer. In the present embodiment, the first electrode 4 is an anode and the second electrode 16 is a cathode. The exciton generation layer 8 and the light-emitting layer 10 adjoin each other in the vertical direction of the light-emitting device 2.

The exciton generation layer 8 includes an exciton generation layer host 17 and quantum dots (semiconductor nanoparticles) 20. The quantum dots 20 are dispersed in the exciton generation layer host 17. The light-emitting layer 10 includes a light-emitting layer host 18 and phosphors 22 as light emitters. The phosphors 22 are dispersed in the light-emitting layer host 18.

The exciton generation layer host 17 includes a compound having a function of injecting and transporting holes. The light-emitting layer host 18 includes a compound having a function of injecting and transporting electrons. The exciton generation layer host 17 and the light-emitting layer host 18 may include a photosensitive material. The exciton generation layer host 17 and the light-emitting layer host 18 may further include a dispersing material not illustrated.

In the light-emitting device 2, when a potential difference is applied between the first electrode 4 and the second electrode 16, holes and electrons are injected into the light-emitting layer 10 from the first electrode 4 and the second electrode 16, respectively. As illustrated in FIG. 1A, a hole from the first electrode 4 reaches the exciton generation layer 8 through the hole injection layer 6. An electron from the second electrode 16 reaches the exciton generation layer 8 through the electron injection layer 14, the electron transport layer 12, and the light-emitting layer 10.

The hole and electron having reached the exciton generation layer 8 are recombined in the quantum dots 20 through the exciton generation layer host 17, and an exciton is generated. The hole transport properties of the hole injection layer 6 and the electron transport properties of the electron injection layer 14, the electron transport layer 12 and the light-emitting layer 10 are adjusted such that excitons are generated in the exciton generation layer 8 as described above.

The quantum dot 20 has a valence band level and a conduction band level. When energy is applied to the quantum dot 20 from an exciton generated by a recombination of a hole and an electron, the exciton is excited from the valence band level to the conduction band level of the quantum dot 20. The quantum dot 20 may be a semiconductor nanoparticle having a core-shell structure with a CdSe core and a ZnS shell, for example.

The phosphor 22 is a phosphor that has a ground level, a singlet excitation level and a triplet excitation level, and emits fluorescence when an exciton excited from the ground level to the singlet excitation level transitions to the ground level.

Figure 1B:
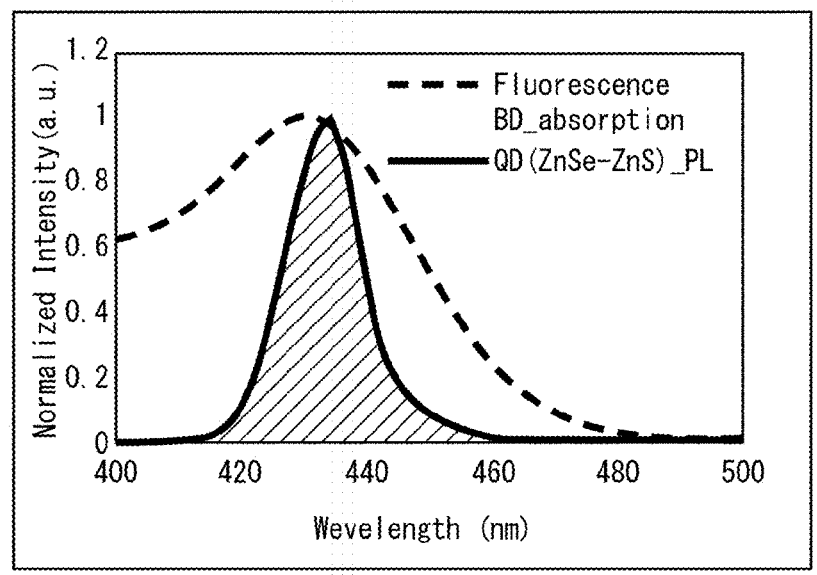

FIG. 1B is a spectrum graph in which an example of the fluorescence spectrum of the quantum dots 20 is indicated by a solid line and an example of the absorption spectrum of the phosphors 22 is indicated by a broken line. The hatched area in FIG. 1B indicates an area where the fluorescence spectrum of the quantum dots 20 and the absorption spectrum of the phosphors 22 overlap. In the spectrum diagrams of the present specification, the horizontal axis indicates the wavelength and the vertical axis indicates the normalized spectrum intensity. The spectrums in FIG. 1B are normalized with respect to the maximum intensity set to 1.

Figure 2:
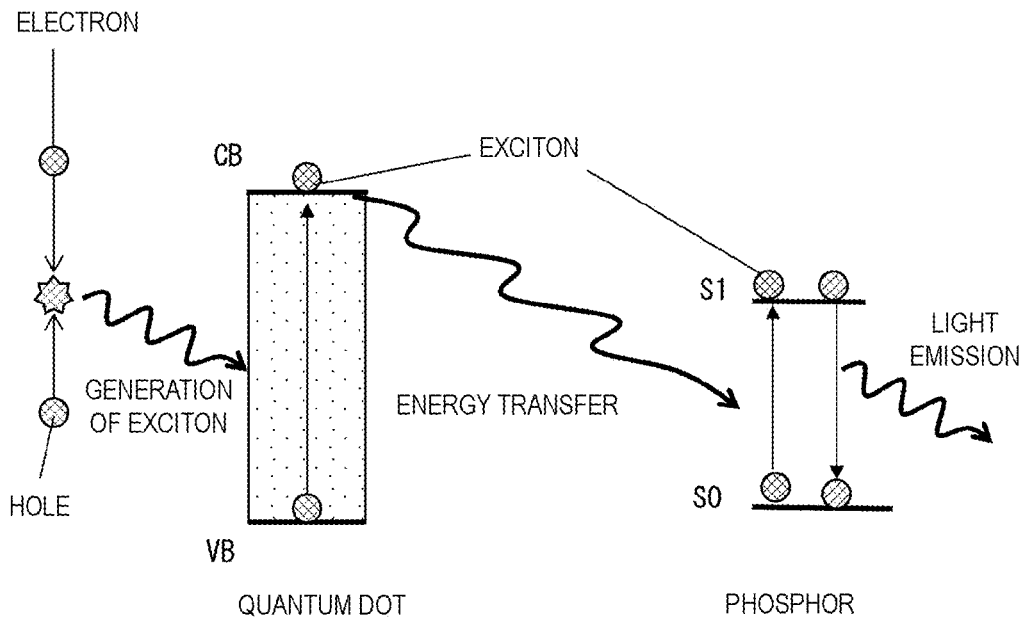
FIG. 2 illustrates a molecular orbit diagram of a quantum dot and a phosphor in the light-emitting device according to the first embodiment of the disclosure, and a light emission mechanism of the light-emitting device.

FIG. 2 illustrates a light emission mechanism of the light-emitting device 2 according to the present embodiment. Left and right molecular orbit diagrams of FIG. 2 illustrate molecular orbits of the quantum dots 20 and the phosphors 22, respectively. Note that, in the molecular orbit diagram of the quantum dot, VB represents the valence band level and CB represents the conduction band level. In the molecular orbit diagram of the phosphor, S0 represents the ground level and S1 represents the singlet excitation level, and, the triplet excitation level is omitted in the diagram. Note that, in the present embodiment, the conduction band level of the quantum dots 20 is higher than the singlet excitation level of the phosphors 22 as illustrated in FIG. 2. This means that the peak wavelength of the light emission spectrum of the quantum dots 20 is shorter than the peak wavelength of the light emission spectrum of the phosphors 22.

The light emission mechanism of light-emitting device 2 according to the present embodiment is described in detail with reference to FIGS. 1A and 1B and FIG. 2.

As illustrated in FIG. 2, when a hole and an electron having reached the exciton generation layer 8 recombine in the quantum dot 20 through the exciton generation layer host 17, an exciton is generated at the quantum dot 20. The exciton is excited from the valence band level to the conduction band level of the quantum dots 20.

Here, energy transfer of the Förster mechanism causes the exciton of the conduction band level of the quantum dots 20 to transition to the singlet excitation level of the phosphors 22 dispersed in the adjacent light-emitting layer 10. In the present embodiment, the Förster mechanism is a mechanism of energy transfer that is caused by a resonance phenomenon of dipole vibrations between the quantum dots 20 and the phosphors 22. The energy transfer of the Förster mechanism does not require direct contact between the quantum dots 20 and the phosphors 22. When the velocity constant of the Förster mechanism is represented by $k_{h^*\to g}$, $k_{h^*\to g}$ is expressed by Equation (1).

[Equation 1]

$$k_{h^*\to g} = \frac{9000c^4 K^2 \phi \ln 10}{128\pi^5 n^4 N\tau R^6} \int \frac{f'_h(\nu)\varepsilon_g(\nu)}{\nu^4} d\nu, \quad (1)$$

where ν represents the number of vibrations, $f'_h(\nu)$ represents a normalized fluorescence spectrum of the quantum dots 20, $\varepsilon_g(\nu)$ represents a molar absorption coefficient of the phosphors 22, N represents an Avogadro's number, n represents a refractive index of the exciton generation layer host 17 and the light-emitting layer host 18, R represents an intermolecular distance between the quantum dots 20 and the phosphors 22, τ represents a fluorescence lifetime of the excitation state of the quantum dots 20, the fluorescence lifetime being actually measured, φ represents a fluorescence quantum yield of the quantum dots 20, and K is a coefficient representing an orientation of the transition dipole moment of the quantum dots 20 and the phosphors 22. Note that, in a case of random orientation, $K^2=2/3$.

The greater the velocity constant $k_{h^*\to g}$, the more the energy transfer of the Förster mechanism becomes dominant. In view of this, the energy transfer from the quantum dots 20 to the phosphors 22 requires overlapping between the light emission spectrum of the quantum dots 20 and the absorption spectrum of the phosphors 22.

As illustrated in FIG. 1B, in the present embodiment, the fluorescence spectrum of the quantum dots 20 and the absorption spectrum of the phosphors 22 at least partially overlap. With this configuration, the above-described energy transfer occurs between the quantum dot 20 and the phosphor 22 whose intermolecular distance is sufficiently small.

In addition, as illustrated in FIG. 1B, in the present embodiment, the peak wavelength of the light emission spectrum of the quantum dots 20 is included in the absorption spectrum of the phosphors 22. In addition, the peak wavelength of the absorption spectrum of the phosphors 22 is included in the light emission spectrum of the quantum dots 20. With this configuration, the energy transfer described above more dominantly occurs.

Finally, when an exciton transitions from the singlet excitation level to the ground level of the phosphor 22, fluorescence having energy equal to the energy difference between the singlet excitation level and the ground level is emitted from the phosphor 22. With the mechanism described above, fluorescence is obtained from the light-emitting device 2.

Figure 3:
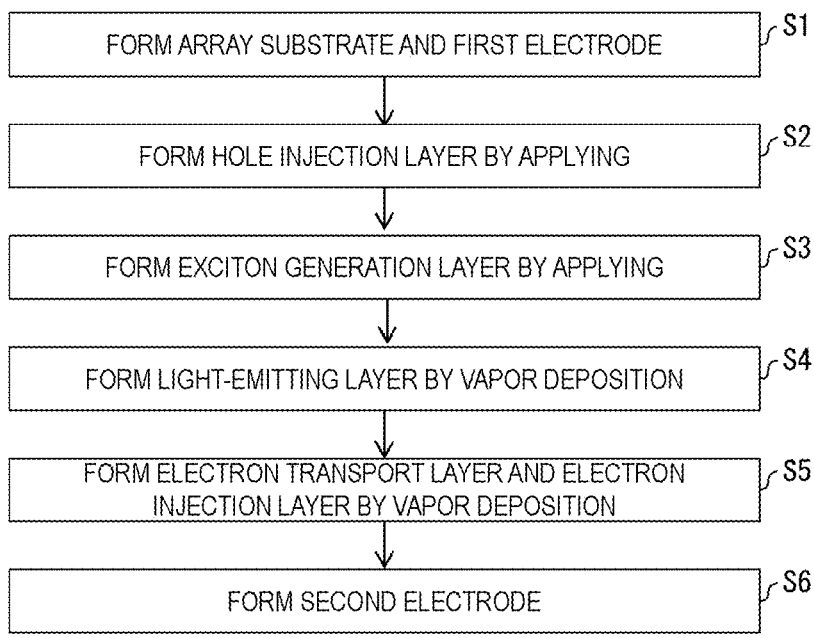
FIG. 3 is a flowchart of a method for manufacturing the light-emitting device according to the first embodiment of the disclosure.

FIG. 3 is a flowchart of an exemplary method for manufacturing the light-emitting device 2 of the present embodiment. The method for manufacturing the light-emitting device 2 is described with reference to FIG. 3.

First, the first electrode 4 is formed on an array substrate in which a TFT is formed (step S1). A known manufacturing method in the related art may be appropriately employed as the method for forming the first electrode. Next, the hole injection layer 6 is formed by applying on the first electrode 4 (step S2). Next, the exciton generation layer host 17 in which the quantum dots 20 are dispersed is applied on the hole injection layer 6 to form the exciton generation layer 8 (step S3). Next, the light-emitting layer 10 in which the phosphors 22 are dispersed is formed on the exciton generation layer 8 by vapor deposition using a mask provided with a plurality of openings (step S4). Subsequently, the electron transport layer 12 and the electron injection layer 14 are sequentially formed on the light-emitting layer 10 by vapor deposition (step S5). Finally, the second electrode 16 is formed on the electron injection layer 14 (step S6). By using the method described above, the light-emitting device 2 according to the present embodiment is obtained.

In the light-emitting device 2 according to the present embodiment, an exciton generated is transferred from the quantum dots 20 of the exciton generation layer 8 to the phosphors 22 of the light-emitting layer 10 by energy transfer of the Förster mechanism, and fluorescence is generated in the phosphors 22. That is, the layer for generating the exciton and the layer for generating the fluorescence are different. Thus, a decrease in fluorescence generation efficiency can be reduced, the decrease being caused by generation of excitons in the same layer.

In addition, in the present embodiment, the light-emitting device 2 can be manufactured by separately performing the manufacturing processes of the exciton generation layer 8 and the light-emitting layer 10. This allows the possibility of entry of impurities into the light-emitting layer 10 to be reduced, the impurities being possibly generated in forming the exciton generation layer 8. Specifically, in the present embodiment, the exciton generation layer 8 is formed by applying, and the light-emitting layer 10 is formed by vapor deposition using a mask. This allows the possibility of entry of impurities into the light-emitting layer 10 to be reduced, the impurities being possibly generated in applying the exciton generation layer 8. Therefore, with the method for manufacturing the light-emitting device 2 according to the present embodiment, the light-emitting device 2 can be obtained that ensures higher reliability for element lifetime.

The concentration of the quantum dots 20 in the light-emitting layer 10 is from 0.1 to 1 mass %, for example. When the concentration of the quantum dots 20 falls within the range described above, a decrease in light emission efficiency due to concentration quenching can be reduced, and generation of excitons in the dispersing material can be suppressed.

In addition, the concentration of the phosphors 22 in the light-emitting layer is from 10 to 30 mass %. When the concentration of the phosphors 22 falls within the range described above, the energy transfer described above can be efficiently caused to occur.

In addition, in the light-emitting device 2 according to the present embodiment, the layer thickness of each of the exciton generation layer 8 and the light-emitting layer 10 is preferably 15 nm or thinner to efficiently cause energy transfer to occur from the quantum dots 20 of the exciton generation layer 8 to the phosphors 22 of the light-emitting layer 10. More preferably, the layer thickness of each of the exciton generation layer 8 and the light-emitting layer 10 ranges from 5 nm to 10 nm. With such a layer thickness, the intermolecular distance between the quantum dots 20 and the phosphors 22 becomes shorter, and the energy transfer efficiently occurs.

In the present embodiment, the light-emitting layer 10 includes the phosphor 22 as the light emitter. However, the disclosure is not limited to this, and the light-emitting layer 10 may include, in place of phosphors, phosphorescent members that emit phosphorescence as the light emitter. Also in this case, the energy transfer of the Förster mechanism occurs from the quantum dots to the phosphorescent members. Thereafter, by intersystem crossing, the excitons transition from the singlet excitation level to the triplet excitation level of the phosphorescent members. At the time when the excitons transition from the triplet excitation level to the ground level of the phosphorescent members, phosphorescence can be obtained from the phosphorescent members. Thus, also in the configuration described above, the layer for generating the exciton and the layer for generating the phosphorescence are different, and therefore a decrease in phosphorescence generation efficiency can be reduced, the decrease being caused by generation of excitons in the same layer.

Further, in the light-emitting device 2 according to the present embodiment, a hole transport layer may be further provided between the hole injection layer 6 and the exciton generation layer 8. The exciton generation layer host 17 of the exciton generation layer 8 may include a material having a high hole transport properties, and thus the exciton generation layer 8 may have a function of a hole transport layer. In addition, in the light-emitting device 2 according to the present embodiment, an electron blocking layer may be further provided between the hole injection layer 6 and the exciton generation layer 8, and a hole blocking layer may be further provided between the light-emitting layer 10 and the electron transport layer 12.

Figure 4:
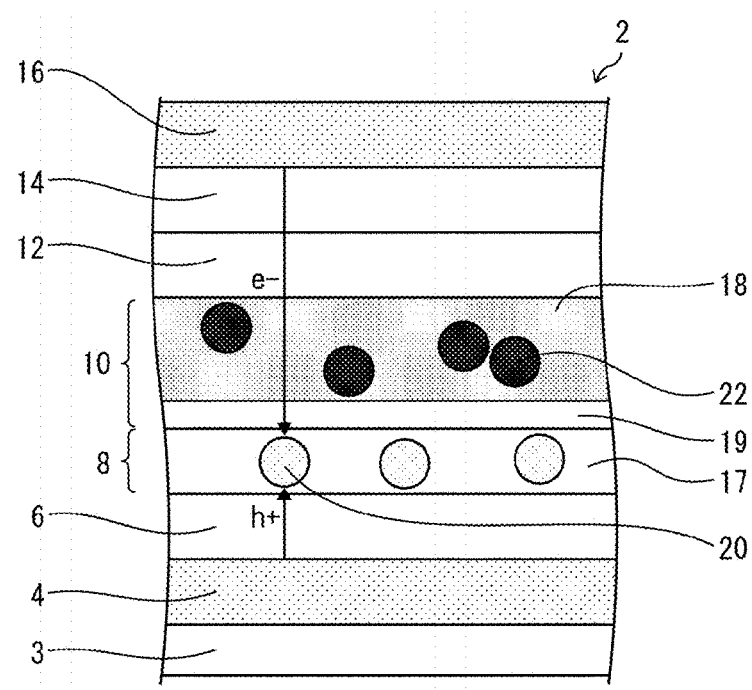
FIG. 4 is a schematic sectional view of a light-emitting device according to a deformation example of the disclosure.

FIG. 4 is a side sectional view illustrating the light-emitting device 2 according to a deformation example of the disclosure. The light-emitting layer 10 further includes a hole blocking layer 19. The hole blocking layer 19 is formed in the upper layer than the exciton generation layer host 17 in which the quantum dots 20 are dispersed, and in the lower layer than the light-emitting layer host 18 in which the phosphors 22 are dispersed. With this configuration, the holes from the first electrode 4 do not pass through the hole blocking layer 19, and therefore entry of the holes into the light-emitting layer host 18 is prevented. Thus, generation of excitons in the phosphors 22 can be prevented, and efficient generation of excitons at the quantum dots 20 can be facilitated.

Second Embodiment

Figure 5A:
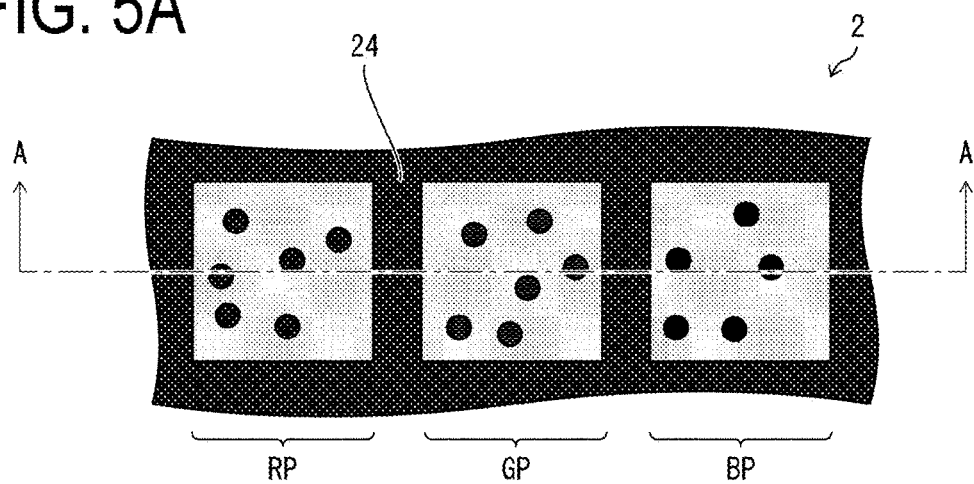
FIGS. 5A and 5B are a schematic top view and a schematic sectional view of a light-emitting device according to a second embodiment of the disclosure.
Figure 5B:
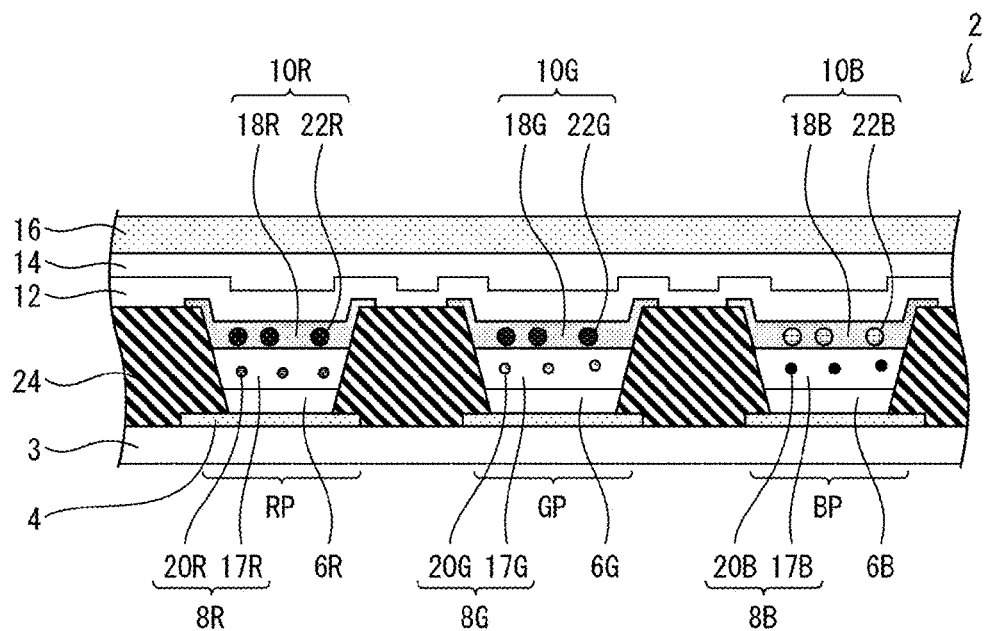

FIGS. 5A and 5B are an enlarged top view and an enlarged sectional view of the light-emitting device 2 according to the present embodiment. FIG. 5A illustrates, through the electron transport layer 12, the electron injection layer 14 and the second electrode 16, the top surface of a region around pixels of the light-emitting device 2. FIG. 5B is a sectional view taken along the line A-A of FIG. 5A.

In the present embodiment, the light-emitting device 2 includes a plurality of pixel regions, RP, GP, and BP in comparison with the preceding embodiment. In the pixel region RP, a hole injection layer 6R, an exciton generation layer 8R and a light-emitting layer 10R are formed on the first electrode 4 in this order from the lower side. Likewise, in the pixel regions GP and BP, hole injection layers 6G and 6B, exciton generation layers 8G and 8B and light-emitting layers 10G and 10B are respectively formed on the first electrode 4 in this order from the lower side. The light-emitting device 2 further includes an edge cover 24. The edge cover 24 includes a plurality of openings and defines a plurality of pixel regions RP, GP, and BP, respectively.

Figure 6A:
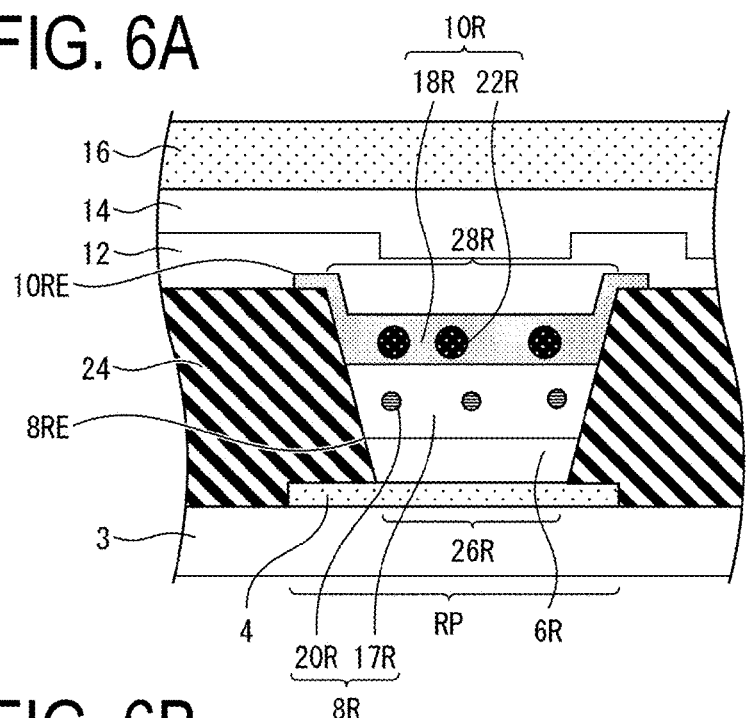
FIGS. 6A and 6B are a schematic top view illustrating a relationship of positions at which an edge cover, an exciton generation layer and a light-emitting layer are formed in the light-emitting device according to the second embodiment of the disclosure.
Figure 6B:
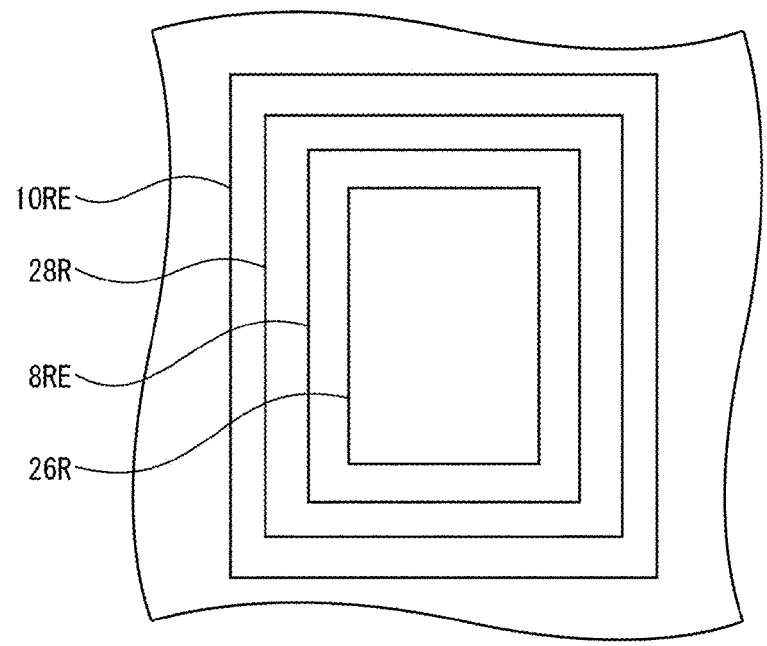

FIGS. 6A and 6B illustrate a relationship of formation positions of the edge cover, the exciton generation layer and the light-emitting layer of the light-emitting device 2 according to the present embodiment. FIG. 6A is an enlarged side sectional view of the pixel region RP in FIG. 5. FIG. 6B is a top view illustrating formation positions of an opening of the edge cover, the exciton generation layer and the light-emitting layer in the pixel region RP.

As illustrated in FIG. 6A, the edge cover 24 includes an opening 26R and an upper end 28R in the pixel region RP. The opening 26R is smaller than the upper end 28R, and the pore of the edge cover 24 extends from the opening 26R up to the upper end 28R with the cross-sectional area of the pore being gradually increased.

Accordingly, as illustrated in FIGS. 6A and 6B, a lower end 8RE of the exciton generation layer 8 is larger than the opening 26R of the edge cover 24. That is, the exciton generation layer 8 covers the opening 26R of the edge cover 24. In addition, the light-emitting layer 10 extends such that an upper end 10RE of the light-emitting layer 10 is formed above the upper end 28R of the edge cover 24. That is, the light-emitting layer 10 straddles the upper end 28R of the edge cover 24 and covers the exciton generation layer 8 and the opening 26R of the edge cover 24.

With reference to FIGS. 5A and 5B again, the exciton generation layer 8 in the pixel region RP includes an exciton generation layer host 17R and quantum dots 20R. Likewise, the exciton generation layer 8 in the pixel region GP includes an exciton generation layer host 17G and a quantum dots 20G, and the exciton generation layer 8 in the pixel region BP includes an exciton generation layer host 17B and the quantum dots 20B.

The light-emitting layer 10 in the pixel region RP includes a light-emitting layer host 18R and phosphors 22R. Likewise, the light-emitting layer 10 in the pixel region GP includes a light-emitting layer host 18G and phosphors 22G, and the light-emitting layer 10 in the pixel region BP includes a light-emitting layer host 18B and phosphors 22B.

In the present embodiment, the light-emitting layer 10 in one of the pixel regions RP, GP, and BP has phosphors different from the phosphors of the light-emitting layers 10 of other different pixel regions. For example, in the present embodiment, the light-emitting layer 10 in the pixel region RP includes the phosphors 22R that emit red light as fluorescence. Likewise, the light-emitting layer 10 in the pixel region GP includes the phosphors 22G that emit green light as fluorescence, and the light-emitting layer 10 in the pixel region BP includes the phosphors 22B that emit blue light as fluorescence.

Here, the blue light is light having the central wavelength of the light emission in a wavelength band from 400 nm to 500 nm. The green light is light having the central wavelength of the light emission in a wavelength band greater than 500 nm and smaller than or equal to 600 nm. The red light is light having the central wavelength of the light emission in a wavelength band greater than 600 nm and smaller than or equal to 780 nm.

In addition, the exciton generation layer 8 in one of the pixel regions RP, GP, and BP may include an exciton generation layer host or quantum dots that differ from the exciton generation layer hosts or the quantum dots of the exciton generation layers 8 in other different pixel regions. However, in the present embodiment, the exciton generation layer hosts 17R, 17G, and 17B and the quantum dots 20R, 20G, and 20B in the pixel regions may include the same member.

Further, the light-emitting layer 10 in one of the pixel regions RP, GP, and BP may include a light-emitting layer host that differs from the light-emitting layer hosts of the light-emitting layers 10 in other different pixel regions. However, in the present embodiment, the light-emitting layer hosts 18R, 18G, and 18B in the pixel regions may include the same member.

Figure 7:
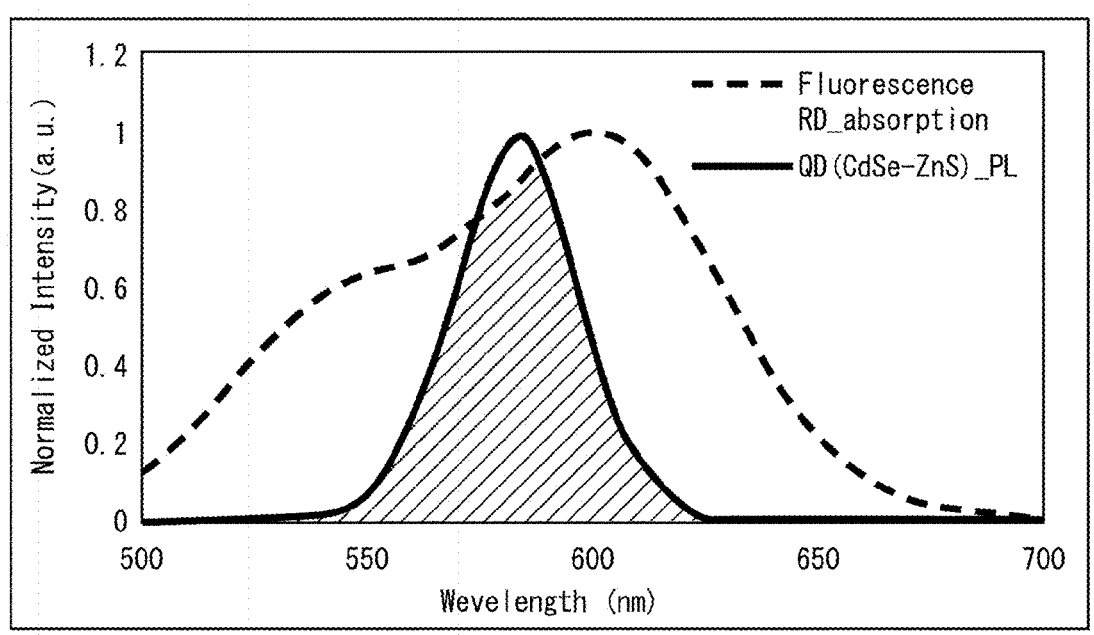
FIG. 7 illustrates examples of a light emission spectrum of quantum dots and an absorption spectrum of phosphors in a red pixel area of the light-emitting device according to the second embodiment of the disclosure.
Figure 8:
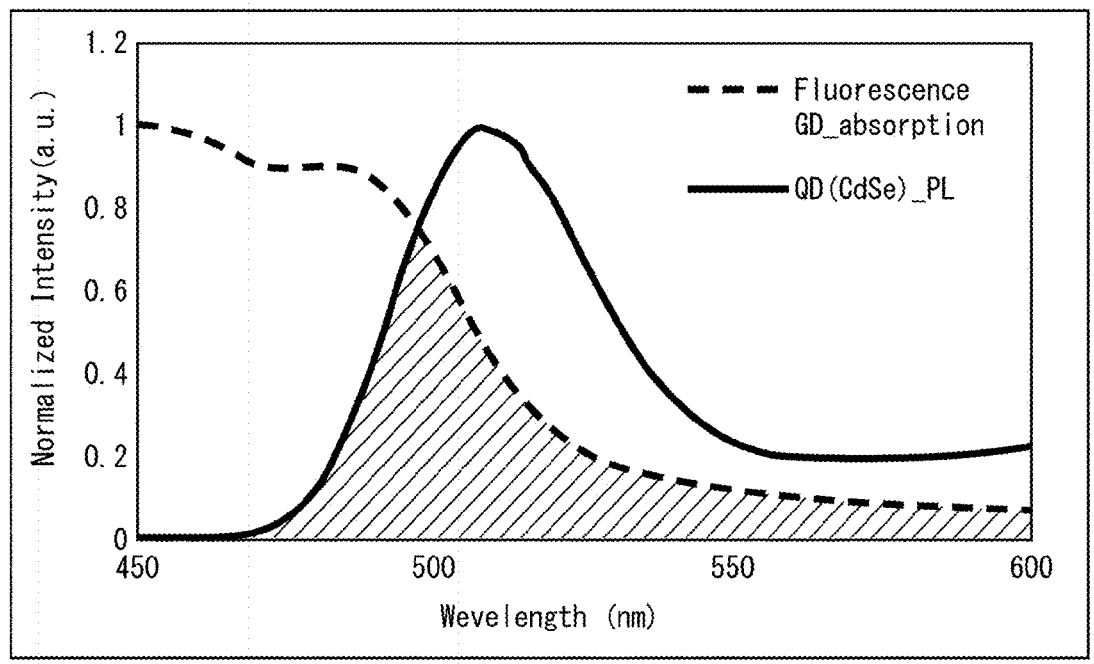
FIG. 8 illustrates examples of a light emission spectrum of quantum dots and an absorption spectrum of phosphors in a green pixel area of the light-emitting device according to the second embodiment of the disclosure.
Figure 9:
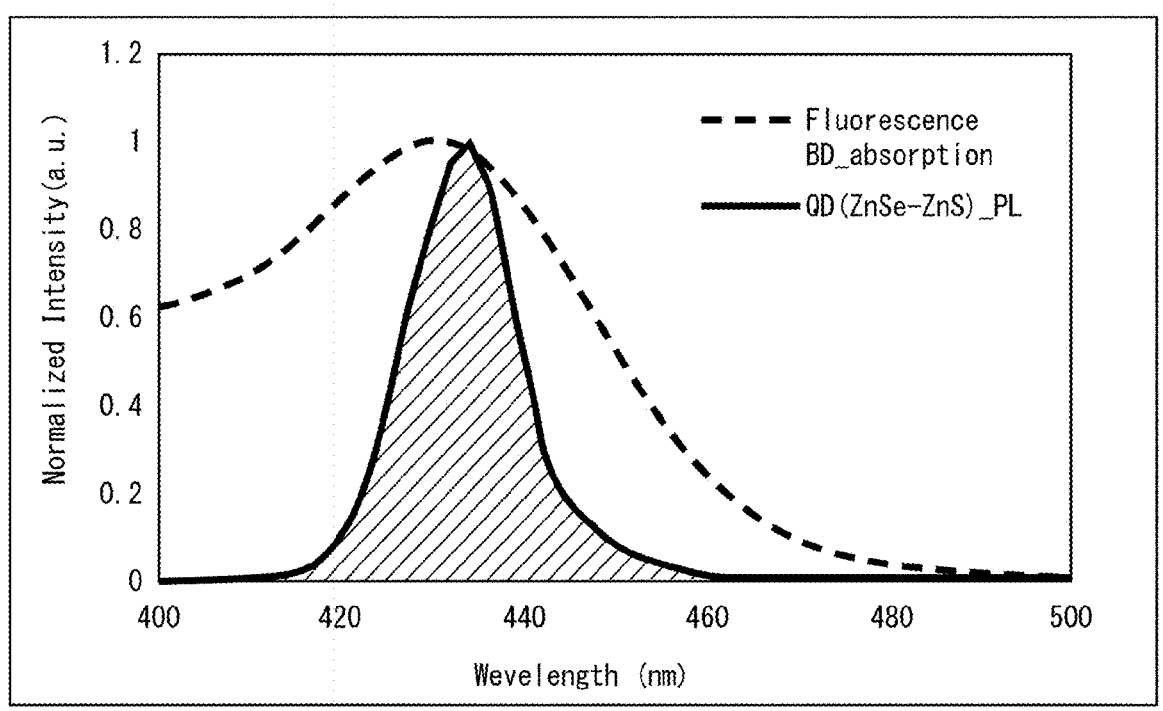
FIG. 9 illustrates examples of a light emission spectrum of quantum dots and an absorption spectrum of phosphors in a blue pixel area of the light-emitting device according to the second embodiment of the disclosure.

FIG. 7 is a spectrum diagram in which an exemplary fluorescence spectrum of the quantum dots 20R is indicated with a solid line, and an exemplary absorption spectrum of the phosphors 22R is indicated with a broken line. FIG. 8 is a spectrum diagram in which an exemplary fluorescence spectrum of the quantum dots 20G is indicated with a solid line, and an exemplary absorption spectrum of the phosphors 22G is indicated with a broken line. FIG. 9 is a spectrum diagram in which an exemplary fluorescence spectrum of the quantum dots 20B is indicated with a solid line, and an exemplary absorption spectrum of the phosphors 22B is indicated with a broken line. In FIGS. 7 to 9, the hatched area indicates an area where the fluorescence spectrum of the quantum dots and the absorption spectrum of the phosphors overlap. The spectrums in FIGS. 7 to 9 are normalized with respect to the maximum intensity set to 1.

In the present embodiment, the quantum dots 20R are CdSe—ZnS quantum dots manufactured by Mesolight LLC. The quantum dots 20G are CdSe quantum dots manufactured by Sigma Aldrich Co. LLC. The quantum dots 20B are ZnSe—ZnS quantum dots manufactured by Sigma Aldrich Co. LLC.

As illustrated in FIGS. 7 to 9, regarding the quantum dots and the phosphors included in the same pixel region, the light emission spectrum of the quantum dots and the absorption spectrum of the phosphors at least partially overlap. With this configuration, the light-emitting device 2 according to the present embodiment emits fluorescence by using a light emission mechanism similar to that of the light-emitting device 2 according to the preceding embodiment. Thus, also in the present embodiment, it is possible to obtain the light-emitting device 2 that can efficiently obtain fluorescence from the phosphors as in the preceding embodiment.

In addition, the wavelengths of the fluorescence from the phosphors in the pixel regions are different from each other, and therefore, by controlling the TFTs to control the light emission from the phosphors in the pixel regions, the light-emitting device 2 capable of performing multi-color display can be provided.

Note that, also in the present embodiment, the light-emitting layers 10 in the pixel regions RP and GP may include phosphorescent members that emit phosphorescence as the light emitters in place of the phosphors. Also in this case, the energy transfer of the Förster mechanism occurs from the quantum dots to the phosphorescent members in the pixel regions RP and GP. The phosphorescent members that emit red light and green light as phosphorescence are relatively easily synthesized, and light emission can be efficiently obtained from excitons that have been transferred by energy transfer from the quantum dots.

The method for manufacturing the light-emitting device 2 of the present embodiment may be implemented such that the edge cover 24 is formed on the array substrate and thereafter steps S1 to S6 in FIG. 3 are performed. In this case, the exciton generation layer 8 may be formed by applying and the light-emitting layer 10 may be formed by vapor deposition, for each of the pixel regions RP, GP, and BP.

Figure 10:
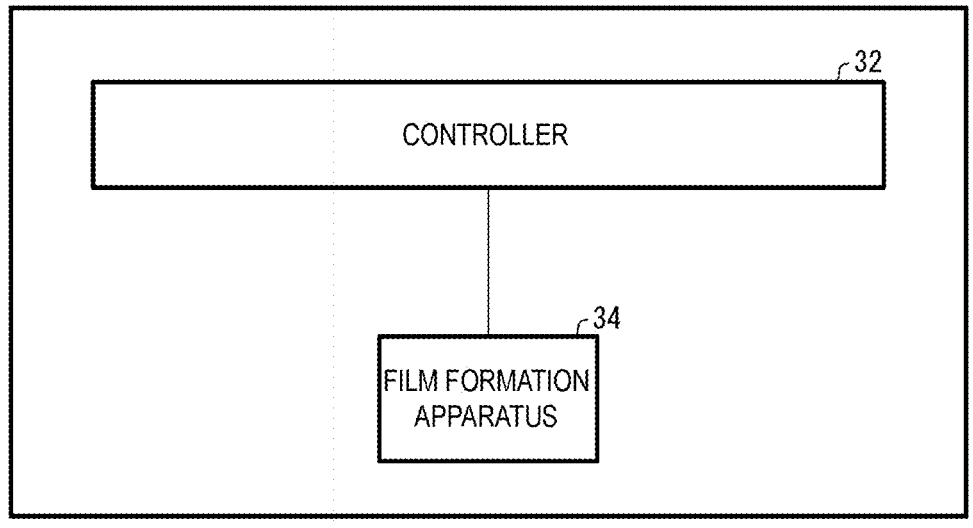
FIG. 10 is a block diagram illustrating a manufacturing apparatus for the light-emitting device according to the embodiments of the disclosure.

FIG. 10 is a block diagram illustrating a manufacturing apparatus 30 of the light-emitting device according to the embodiments. The manufacturing apparatus 30 of the light-emitting device may include a controller 32 and a film formation apparatus 34. The controller 32 may control the film formation apparatus 34. The film formation apparatus 34 may form each layer of the light-emitting device 2.

Supplement

A light-emitting device according to a first aspect includes: an exciton generation layer in which quantum dots are dispersed; a light-emitting layer in which light emitters being phosphors or phosphorescent members are dispersed, the light-emitting layer adjoining the exciton generation layer in a vertical direction; a first electrode in a lower layer than the exciton generation layer and the light-emitting layer; and a second electrode in an upper layer than the exciton generation layer and the light-emitting layer. A light emission spectrum of the quantum dots and an absorption spectrum of the light emitters at least partially overlap each other.

In a second aspect, an exciton generated in the quantum dots transitions, through a resonance phenomenon of a dipole vibration, to an excitation level of the light emitters, and the light emitters emit light.

In third aspect, a peak wavelength of the light emission spectrum of the quantum dots is shorter than a peak wavelength of the light emission spectrum of the light emitters.

In a fourth aspect, the peak wavelength of the light emission spectrum of the quantum dots is included in the absorption spectrum of the light emitters.

In a fifth aspect, the peak wavelength of the absorption spectrum of the light emitters is included in the light emission spectrum of the quantum dots.

In a sixth aspect, a concentration of the quantum dots in the exciton generation layer ranges from 10 to 30 mass %.

In a seventh aspect, a concentration of the light emitters in the light-emitting layer ranges from 0.1 to 1 mass %.

In an eighth aspect, an edge cover is provided, and the edge cover includes a plurality of openings, the edge cover being configured to define the exciton generation layer and the light-emitting layer in a plurality of pixel regions. For each of the plurality of openings, the exciton generation layer covers each of the plurality of openings, and the light-emitting layer straddles an upper end of the edge cover and covers the exciton generation layer and each of the plurality of openings.

In a ninth aspect, the exciton generation layer and the light-emitting layer each include a photosensitive material; the quantum dots are dispersed in the photosensitive material of the exciton generation layer; and the light emitters are dispersed in the photosensitive material of the light-emitting layer.

In a tenth aspect, the exciton generation layer functions as a hole transport layer.

In an eleventh aspect, a hole blocking layer through which a hole does not pass is provided between the exciton generation layer and the light-emitting layer.

In a method of manufacturing a light-emitting device according to a twelfth aspect, the light-emitting device including: an exciton generation layer in which quantum dots are dispersed; a light-emitting layer in which light emitters being phosphors or phosphorescent members are dispersed, the light-emitting layer adjoining the exciton generation layer in a vertical direction, wherein an absorption spectrum of the light emitters at least partially overlaps a light emission spectrum of the quantum dots; a first electrode in a lower layer than the exciton generation layer and the light-emitting layer; and a second electrode in an upper layer than the exciton generation layer and the light-emitting layer, the method includes: an exciton generation layer forming step for forming the exciton generation layer; and a light-emitting layer forming step for forming the light-emitting layer.

In a thirteenth aspect, an exciton generated at the quantum dots transitions, through a resonance phenomenon of a dipole vibration, to an excitation level of the light emitters, and the light emitters emit light.

In a fourteenth aspect, in the light-emitting layer forming step, the light-emitting layer is formed by vapor deposition using a mask provided with a plurality of openings.

In a fifteenth aspect, in the exciton generation layer forming step, the exciton generation layer is formed by applying.

A manufacturing apparatus for a light-emitting device according to a sixteenth aspect includes a film formation apparatus configured to form an exciton generation layer in which quantum dots are dispersed; a light-emitting layer in which light emitters being phosphors or phosphorescent members are dispersed, wherein an absorption spectrum of the light emitters at least partially overlaps a light emission spectrum of the quantum dots; a first electrode in a lower layer than the exciton generation layer and the light-emitting layer; and a second electrode in an upper layer than the exciton generation layer and the light-emitting layer.

The disclosure is not limited to each of the embodiments stated above, and various modifications may be implemented within a range not departing from the scope of the claims. Embodiments obtained by appropriately combining technical approaches stated in each of the different embodiments also fall within the scope of the technology of the disclosure. Moreover, novel technical features may be formed by combining the technical approaches stated in each of the embodiments.

REFERENCE SIGNS LIST

2 Light-emitting device
4 First electrode
8 Exciton generation layer
10 Light-emitting layer
16 Second electrode
17 Exciton generation layer host
18 Light-emitting layer host
20 Quantum dot
22 Phosphor

The invention claimed is:

1. A light-emitting device comprising:
an exciton generation layer in which quantum dots are dispersed;
a light-emitting layer in which light emitters being fluorescent members or phosphorescent members are dispersed, the light-emitting layer adjoining the exciton generation layer in a vertical direction;
a first electrode in a lower layer than the exciton generation layer and the light-emitting layer; and
a second electrode in an upper layer than the exciton generation layer and the light-emitting layer,
wherein a light emission spectrum of the quantum dots and an absorption spectrum of the light emitters at least partially overlap each other,
the light-emitting device further includes an edge cover including a plurality of openings, the edge cover being configured to define the exciton generation layer and the light-emitting layer in a plurality of pixel regions, and
for each of the plurality of openings, the exciton generation layer covers each of the plurality of openings, and the light-emitting layer straddles an upper end of the edge cover and covers the exciton generation layer and each of the plurality of openings.

2. The light-emitting device according to claim 1, wherein the exciton generation layer and the light-emitting layer each include a photosensitive material,
the quantum dots are dispersed in the photosensitive material of the exciton generation layer, and
the light emitters are dispersed in the photosensitive material of the light-emitting layer.

3. The light-emitting device according to claim 1, wherein the exciton generation layer functions as a hole transport layer.

4. The light-emitting device according to claim 1,
wherein a hole blocking layer through which a hole does not pass is provided between the exciton generation layer and the light-emitting layer.

5. The light-emitting device according to claim 1,
wherein an exciton generated at the quantum dots transitions, through a resonance phenomenon of a dipole vibration, to an excitation level of the light emitters, and the light emitters emit light.

6. The light-emitting device according to claim 1,
wherein a peak wavelength of the light emission spectrum of the quantum dots is shorter than a peak wavelength of the light emission spectrum of the light emitters.

7. The light-emitting device according to claim 1,
wherein a peak wavelength of the light emission spectrum of the quantum dots is included in the absorption spectrum of the light emitters.

8. The light-emitting device according to claim 1,
wherein a peak wavelength of the absorption spectrum of the light emitters is included in the light emission spectrum of the quantum dots.

9. The light-emitting device according to claim 1,
wherein a concentration of the quantum dots in the exciton generation layer ranges from 10 to 30 mass %.

10. The light-emitting device according to claim 1,
wherein a concentration of the light emitters in the light-emitting layer ranges from 0.1 to 1 mass %.

11. A light-emitting device comprising:
an exciton generation layer in which quantum dots are dispersed;
a light-emitting layer in which light emitters being fluorescent members or phosphorescent members are dispersed, the light-emitting layer adjoining the exciton generation layer in a vertical direction;
a first electrode in a lower layer than the exciton generation layer and the light-emitting layer; and
a second electrode in an upper layer than the exciton generation layer and the light-emitting layer,
wherein a light emission spectrum of the quantum dots and an absorption spectrum of the light emitters at least partially overlap each other, and
a hole blocking layer through which a hole does not pass is provided between the exciton generation layer and the light-emitting layer.

12. The light-emitting device according to claim 11,
wherein an exciton generated at the quantum dots transitions, through a resonance phenomenon of a dipole vibration, to an excitation level of the light emitters, and the light emitters emit light.

13. The light-emitting device according to claim 11,
wherein a peak wavelength of the light emission spectrum of the quantum dots is shorter than a peak wavelength of the light emission spectrum of the light emitters.

14. The light-emitting device according to claim 11,
wherein a peak wavelength of the light emission spectrum of the quantum dots is included in the absorption spectrum of the light emitters.

15. The light-emitting device according to claim 11,
wherein a peak wavelength of the absorption spectrum of the light emitters is included in the light emission spectrum of the quantum dots.

16. The light-emitting device according to claim 11,
wherein a concentration of the quantum dots in the exciton generation layer ranges from 10 to 30 mass%.

17. The light-emitting device according to claim 11,
wherein a concentration of the light emitters in the light-emitting layer ranges from 0.1 to 1 mass%.

18. The light-emitting device according to claim 11,
wherein the exciton generation layer and the light-emitting layer each include a photosensitive material,
the quantum dots are dispersed in the photosensitive material of the exciton generation layer, and
the light emitters are dispersed in the photosensitive material of the light-emitting layer.

19. The light-emitting device according to claim 11,
wherein the exciton generation layer functions as a hole transport layer.

* * * * *